United States Patent [19]

Le Can et al.

[11] 4,453,096
[45] Jun. 5, 1984

[54] MOS TRANSISTOR TYPE INTEGRATED CIRCUIT FOR THE EXECUTION OF LOGICAL OPERATIONS ON A PLURALITY OF DATA SIGNALS

[75] Inventors: Claude J. P. F. Le Can, Beek; Karel Hart, Nijmegen, both of Netherlands

[73] Assignee: U.S. Philips Corporation, New York, N.Y.

[21] Appl. No.: 136,237

[22] Filed: Apr. 1, 1980

Related U.S. Application Data

[63] Continuation of Ser. No. 843,982, Oct. 20, 1977, abandoned.

[30] Foreign Application Priority Data

Nov. 4, 1976 [NL] Netherlands .................. 7612223

[51] Int. Cl.³ ............... H03K 19/094; H03K 19/173; H03K 19/20
[52] U.S. Cl. ............................. 307/448; 307/243; 307/244; 307/279; 307/451; 307/468; 307/469; 307/471; 307/472
[58] Field of Search ................ 307/448–453, 307/468–469, 471, 472, 241–244

[56] References Cited

U.S. PATENT DOCUMENTS

| | | | |
|---|---|---|---|
| 3,603,814 | 9/1971 | Ohashi | 307/241 X |
| 3,651,342 | 3/1972 | Dingwall | 307/451 X |
| 3,767,906 | 10/1973 | Pryor | 307/471 X |
| 3,930,169 | 12/1975 | Kuhn, Jr. | 307/481 X |
| 3,965,459 | 6/1976 | Spencer et al. | 307/243 X |
| 4,006,365 | 2/1977 | Marzin et al. | 307/471 |
| 4,010,385 | 3/1977 | Kroll | 307/243 |
| 4,021,781 | 5/1977 | Caudel | 307/453 X |
| 4,039,858 | 8/1977 | Stewart | 307/471 X |
| 4,049,974 | 9/1977 | Boone et al. | 307/468 X |
| 4,064,405 | 12/1977 | Cricchi | 307/451 |
| 4,084,105 | 4/1978 | Teranishi et al. | 307/242 X |

*Primary Examiner*—Larry N. Anagnos
*Attorney, Agent, or Firm*—James J. Cannon, Jr.

[57] ABSTRACT

Four-pole circuits for iterative modular use in integrated circuits fabricated with complementary MOS (C-MOS) technology or LOCMOS technology, having a high density of circuit elements and high speed obtained at low dissipation. Each of said four-pole circuit modules has two signal inputs, a control input and a signal output line. The four-pole circuit modules may be constructed from two series connected complementary MOS transistors or two series-connected p-MOS transistors. In the latter case the control input must be doubled to receive the control signal and its inverted value. The signal outut is then alternatively connected to one of the two signal inputs (logically or physically) by each of the two values of the control signal. This two-level logic, input signal and control signal, results in circuit modules easily used in computer aided design for multiplexers in which said four-pole circuits are successively arranged in two or more levels, for a BUS-configuration; and can be arranged in series having a common control and different combinations of input signals to form an arithmetic member for one bit in respect of two input quantities. Series of this kind can be combined to form a multi-bit arithmetic member.

3 Claims, 25 Drawing Figures

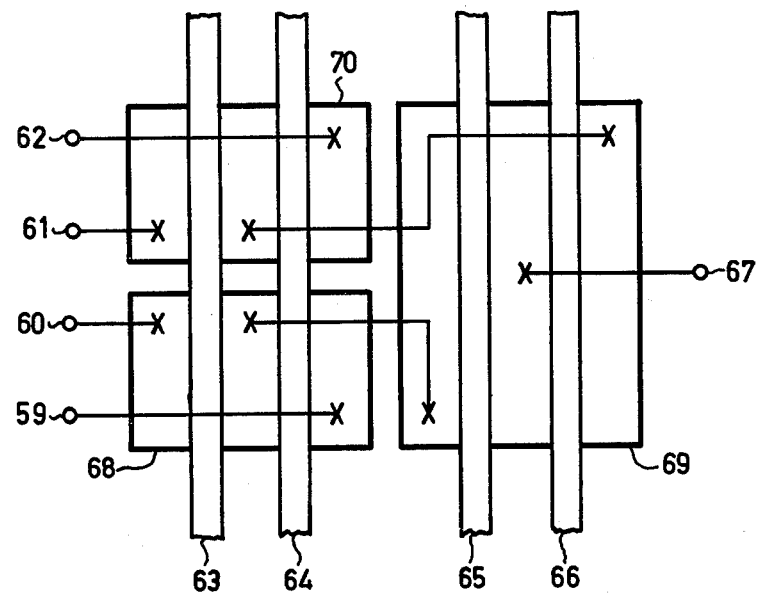
Fig. 12
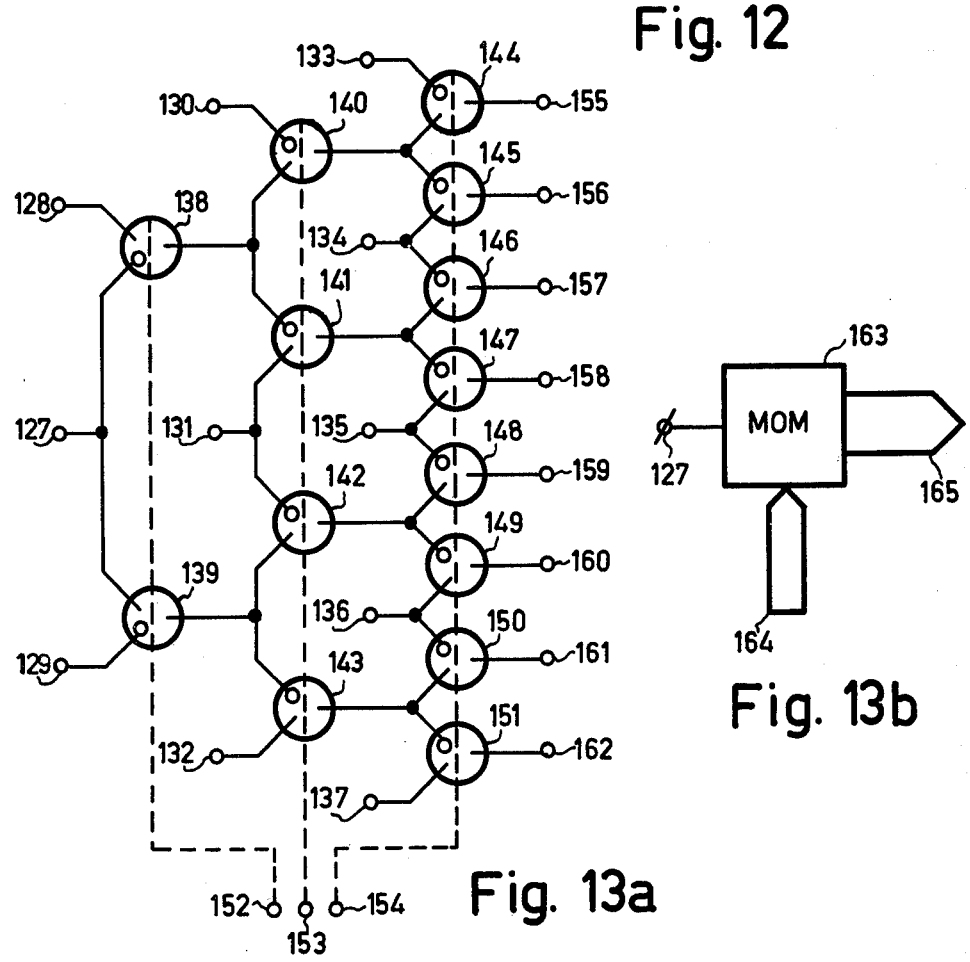
Fig. 13a
Fig. 13b

| 209 | 210 | 211 | 228 |
|---|---|---|---|
| 0 | 0 | 0 | S2 |
| 0 | 0 | 1 | S1 |
| 0 | 1 | 0 | A.B |
| 0 | 0 | 1 | B |
| 1 | 0 | 0 | $\overline{A}$ |
| 1 | 0 | 1 | $\overline{A+B}$ |
| 1 | 1 | 0 | A⊕B |
| 1 | 1 | 1 | S0 |
Fig. 19
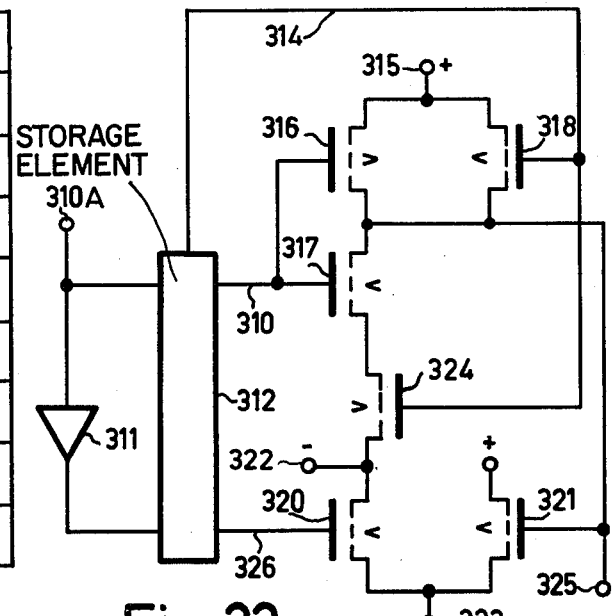
Fig. 22
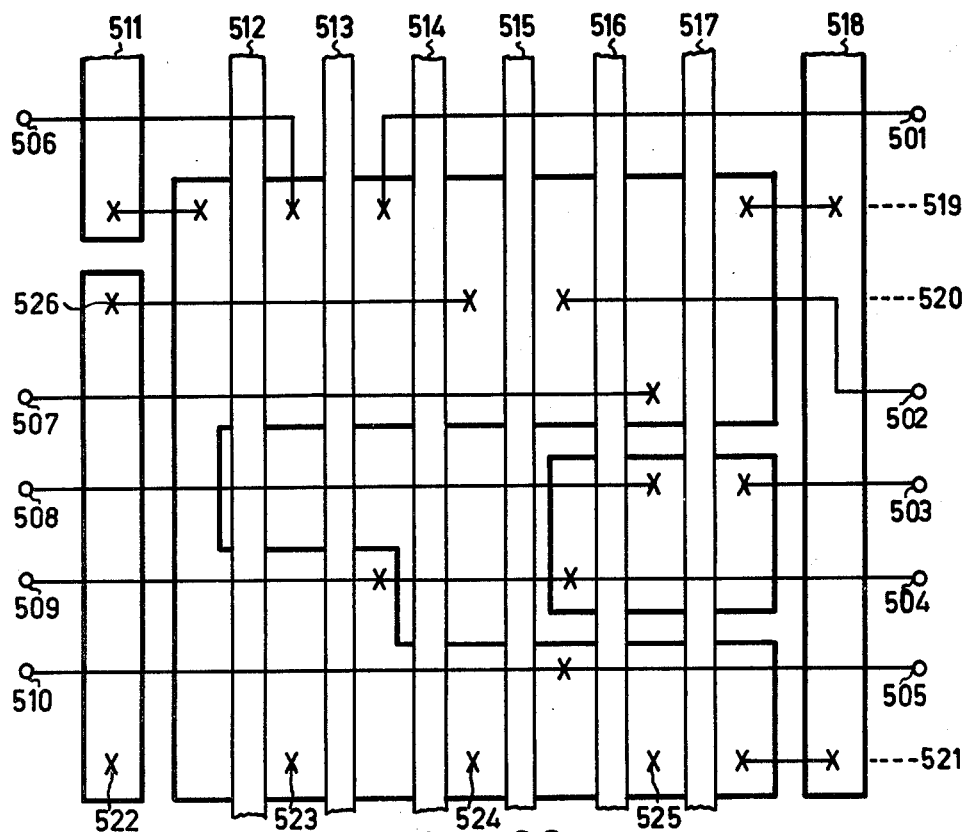
Fig. 20

MOS TRANSISTOR TYPE INTEGRATED CIRCUIT FOR THE EXECUTION OF LOGICAL OPERATIONS ON A PLURALITY OF DATA SIGNALS

This is a continuation of application Ser. No. 843,982, filed Oct. 20, 1977, now abandoned.

BACKGROUND OF THE INVENTION

1. Field of the Invention

This invention relates to an integrated circuit module suitable for the execution of logic operations on at least three input signals which appear together on inputs of the circuit, said circuit module having two supply lines for connection to a supply source, polarity supply lines having alternative sign, combinations of MOS transistors of at least one conductivity type connected therebetween, and also having signal lines for control of the state of conductivity of said MOS transistors.

2. Description of the Prior Art

Systems comprising MOS transistors of conductivity types which may or may not be mutually complementary are commonly used. A sub-category of such systems is that in which said MOS transistors comprise a layer of silicon nitride, originally used during the manufacture as a mask and being provided on a silicon substrate layer, electrically separating silicon oxide obtained from the semiconductor body being provided in openings in said deposited layer. This technology is known as the LOCMOS system, and is known from an article by B. B. M. Brandt et al, "LOCMOS a new technology for complementary MOS circuits", Philips Techn. Rev. 34, 1974, No. 1, pages 19-23. The combination of MOS transistors of opposite conductivity type offers advantages, because often a very low dissipation is achieved. Moreover, a high processing speed of the signals can be achieved, while a high packing density can be realized by the manufacturing technology described in said article. This can have a favourable effect on the processing speed.

Circuits of the kind described are often used to achieve an increasingly larger number of circuit elements per semiconductor chip, especially for microprocessors. Circuit modules of this kind are composed of elementary components such as logic gates which perform AND, OR, NAND, NOR and possibly other logic functions. The inputs of such gates usually have the same rank relative to each other, while a single logic function output is provided, possibly together with an output which is inverted with respect thereto. The invention has for its object to provide a system which can be readily designed by a computer. The technology described offers the possibility of improvement by arranging all transistors pair-wise, that is to say alternatively in one of two halves of a circuit. When a library of a number of cell modules is available, a computer can design a device by choosing cell modules from the library. The units of the library, however, appear to have a complex construction. Furthermore, it has been found that in many circuits the connections for signal transport between the various parts of a circuit occupy a large part of the area of the substrate layer, for example, up to 50%. The resultant larger surface area of the circuit is a drawback from a manufacturing point of view because of the inherently lower yield.

SUMMARY OF THE INVENTION

In this respect, the invention has for its object to provide a system which can be easily designed if a large number of internal signal transports occurs, whether or not via BUS-lines. The invention has for its object to provide a library comprising a limited number of cell modules which can be optimized per se in advance and which can be iteratively used in the circuit. The invention aims for the use of a single cell for a large number of applications within an integrated circuit, for data transport as well as for the implementation of logic functions.

The objects in accordance with the invention are achieved in that the circuit comprises four-pole circuit cell modules which are arranged as selection switches in modular form and which include at least two series-connected MOS transistors, there being provided three signal connections per four-pole circuit module, i.e. two signal input lines and one signal output line, there also being provided one control line per four-pole circuit module, each of two voltage levels of the control signal received on a control line of a four-pole circuit alternatively connecting at each level the signal output line of its respective four-pole circuit to one of two signal input lines of the same four-pole circuit module. As will appear from the following description, the advantages of the invention are achieved by the iterative modular use of the said four-pole circuit, or by assembling given circuit elements exclusively from these four-pole circuits. The advantage is achieved by linking these circuit modules to form one-dimensional or two-dimensional arrays. The connection between a signal input line and a signal output line may be a direct connection. On the other hand, this connection may be only logical (for example, inversion always occurs automatically).

Preferably, two p-channel transistors are connected in series within a four-pole circuit, the junction of said transistors forming a signal output line, the control electrodes being connected so as to transmit logically inverted signals for their combined functioning as the said control line, the other connections acting as signal input lines. Four-pole circuit modules of this kind can be readily realized, the double supply of a control signal not being objectionable. In many cases, the control signals can simultaneously control a number of four-pole circuits, whereby they need be generated only once.

On the other hand, it is advantageous to connect two transistors of complementary conductivity type in series within a four-pole circuit, the junction of said two transistors constituting a signal output line and the control electrodes being interconnected so as to form said control line, the remaining connections acting as signal input lines. The generating of the control signal is then even simpler.

Preferably, at least one signal connection of at least two of said four-pole circuits is interconnected. As a result of such a configuration, said four-pole circuit modules can be used in parallel as well as in series, depending on whether corresponding or non-corresponding or dissimilar signal connection types are interconnected. The number of external connections required is thus reduced, while connection flexibility is maintained. A varied configuration is thus possible, while the structure remains simple, which is a very desirable aspect for computer design.

Preferably, two of three said four-pole circuits have a signal connection of a first type connected to a signal connection of a second type of the third four-pole circuit, said two four-pole circuit modules having their control lines interconnected, but separate from the control line of the third four-pole circuit, in order to form a multiplexer having at least two selection levels. If one signal output line is connected to two different signal input lines, distribution of the signal to a specified output connection is possible. If the signal output lines of two different four-pole circuits are connected to the respective signal input lines of the third four-pole circuit, the selective conduction of an output signal is realized. This results in various multiplexer functions.

Preferably, the circuit furthermore comprises, in order to form a BUS-line, a number of circuit modules having at least three poles which comprise transistors having a construction similar to that of the transistors present in said four-pole circuits, each circuit comprising a signal input line, a control line and interconnected signal output lines among said circuits. A BUS line of this kind enables an attractive extension of the number of possibilities within the scope of the invention.

Preferably, all control lines of a series of parallel-connected four-pole circuits are interconnected, the respective signal input lines receiving at least four different logic signals in order to form at least four different logic functions on the basis thereof. Such a series of four-pole circuits enables the generation of a large number of logic functions in an attractive manner.

Preferably, at least one signal input line of the series is connected to an output of a logic "0" generator, one signal input line being connected to an output of a logic "1" generator, the common control line of the series being connected to an output of a logic element, two inputs of which are suitable to receive two two-level, variable input signals to be processed, it being possible to apply at least one of said signals also to a signal input lines of said series. This results in simple control of the formation of a large number of feasible functions.

Preferably, said logic element is suitable for forming an EXCLUSIVE-OR function, it being possible to supply exclusively one of said input signals directly as well as via an inversion element to signal input lines of said series. The formation of an EXCLUSIVE-OR function is simple, and so is the pattern of connections which can be realized thereby.

Preferably, said series forms part of a row of similarly constructed series of successive significance levels, at least one signal output line of a series being connected to a signal input line of the series of next-higher significance level, if any. An arithmetic and logic unit (ALU unit) having a number of successive significance levels can thus be attractively realized, simple processing of two numbers or words consisting of a plurality of bit signals thus being possible.

Preferably, two of said four-pole circuit modules each have a third series-connected transistor on a similar signal input side in order to form a hold circuit, the control electrode of said third transistor being crosswise connected, together with the control electrode of the dissimilar one of said first two said transistors, to the signal output line of the other four-pole circuit. This offers the possibility of forming a further attractive function. The invention thus has two aspects. Said four-pole circuit modules are suitable, in view of their function, for iterative use in a logic circuit as parts of more complex functions. Second, the function of the four-pole circuit cell or modules is such that it can be realized in a form which is suitable for use in computer aided design methods (CAD) for logic circuits.

BRIEF DESCRIPTION OF THE DRAWINGS

The invention will be described in detail hereinafter with reference to the Figures.

FIG. 12 shows an embodiment of the multiplexer of FIG. 11a in the form of an integrated circuit.

FIGS. 13a and 13b show a multi-output multiplexer and a relevant compact symbol.

FIG. 19 shows the functions performed thereby.

FIG. 20 shows the spatial construction thereof.

FIG. 22 shows a buffer element for carry signals.

DESCRIPTION OF THE PREFERRED EMBODIMENT

Figure 1A:
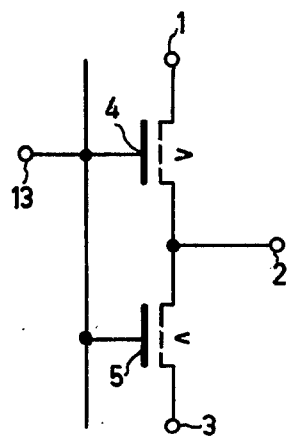
FIGS. 1a and 1b show four-pole circuit cells or modules in accordance with the invention.

FIG. 1a shows a first four-pole circuit module in accordance with the invention, comprising two complementary MOS transistors. Terminal 13 is connected to the control electrodes of both transistors and carries a signal X which can be supplied by a control signal generator (not shown). Terminal 1 is connected to the drain electrode of the p-channel transistor 4 and carries the signal Y0 which may be supplied by a signal generator (not shown). Terminal 3 is connected to the source electrode of n-channel transistor 5 and carries the signal Y1 which is supplied by a signal generator (not shown). Terminal 2 carries the output signal Y. If the voltage on terminal 13 is lower than a given threshold value relative to the substrate layer of transistor 4, this transistor is conductive while transistor 5 is not, the logic values of Y and Y0 then correspond, Y=Y0. If terminal 13 carries a voltage above a given threshold voltage relative to the substrate layer of n-channel transistor 5, this transistor is conductive (while the other transistor is not) and Y=Y1. If terminals 3 and 1 are connected to the negative and the positive supply voltage respectively, an attractive inverter is thus obtained.

The invention does not specifically relate to one inverter of this kind, but rather to the modular, that is, iterative use of such four-pole modules having two signal input lines in order to form the various switching functions by signal transport.

In accordance with FIG. 1a, a four-pole circuit incorporates transistors which are already complementary with respect to each other. The operation of the circuit is very good, especially if the signal on the terminal 3 has a higher voltage value than the signal on the terminal 1.

Figure 1B:
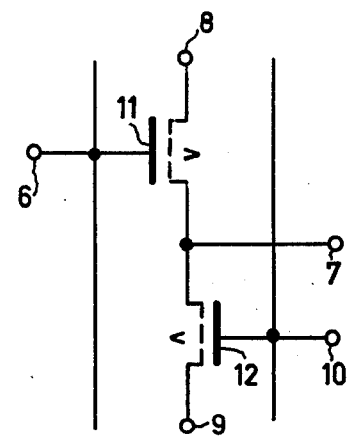

FIG. 1b shows a different embodiment of a four-pole circuit module in accordance with the invention, comprising transistors of one conductivity type. Terminal 6 is connected to the control electrode of p-channel transistor 11 and carries the signal X. Terminal 10 is connected to the control electrode of p-channel transistor 12 and carries the inverted value of the signal X, which is denoted as NX. Terminal 8 is connected to the drain electrode of transistor 11 and carries the signal Y0. Terminal 9 is connected to the source electrode of transistor 12 and carries the signal Y1. Terminal 7 is connected to the remaining electrodes of the transistors and carries the signal Y. The operation of the four-pole circuit is the same as that of the circuit shown in FIG. 1a.

Figure 2:
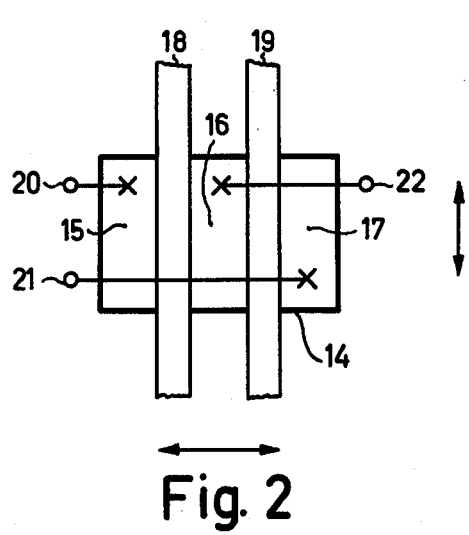
FIG. 2 shows diagrammatically an embodiment in the form of an integrated circuit.

FIG. 2 shows, by way of example, a four-pole circuit module in accordance with FIG. 1b which is constructed as an element of an integrated circuit in "silicon-gate" technology. Construction in other MOS technologies, for example, according to the LOCMOS systems, is similar. On n-type substrate 14 three adjacently situated p-regions 15, 16, 17 are provided by diffusion. These regions are separated from each other in that polysilicon paths 18 and 19 (carrying the control signals X and NX, respectively) have acted as a mask for said p-regions during the manufacture, together with an external mask whereby the more or less rectangular circumference of the combined regions 15–17 has been determined. The polysilicon paths may act as conductors for carrying the control signals. In the direction transverse to the polysilicon paths, aluminium conductor paths are provided in a final manufacturing step, said aluminum paths carrying the signals Y0 (20), Y1 (21) and Y (22), respectively, and having connections to the relevant p-regions, said connections being denoted by a cross. Besides the positions of these crosses, there is no electrical connection to the said aluminum conductors. The aluminum conductors are shown as single strokes; actually, they have a width which is comparable to that of the polysilicon pths and they form grids in two directions with more or less fixed periods which may have values of, for example, 20 μm. As a result of a periodicity of this kind, the machine aided design of a circuit is facilitated. The use of p-channel transistors is attractive. In given cases n-channel transistors will be used. In this example, the four-pole circuit comprises transistors of a single conductivity type as will appear hereinafter, a four-pole circuit of this kind can also be advantageously used in surroundings in which both p-channel and n-channel transistors are included.

The circuit shown in FIG. 1a can be implemented on a semiconductor body in a similar way.

Figure 3:
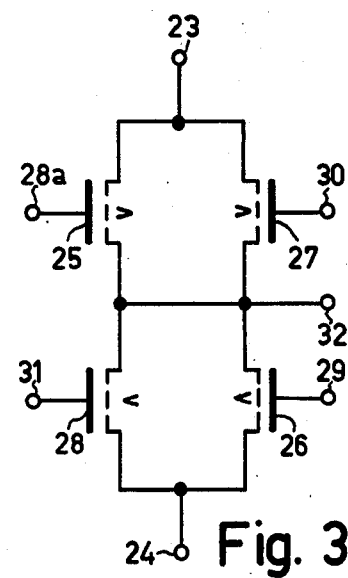
FIG. 3 shows a third four-pole circuit in accordance with the invention.

FIG. 3 shows a third four-pole circuit module. The circuit comprises a signal terminal 23 (Y0), a signal terminal 24 (Y1), two p-channel transistors (25, 26), two n-channel transistors (27, 28), control terminals 28a, 29 (X) and 30, 31 (NX) and a signal output terinal 32 (Y). The operation is very good as a result of the symmetrical construction. If a high signal (logic 0) is present on terminals 28a, 29, there is no problem as regards a threshold value to be exceeded by the signal. On the other hand, the additional transistors require additional semiconductor surface area. This four-pole circuit can again be advantageously implemented on a semiconductor body in the manner shown in FIG. 2.

Figure 4:
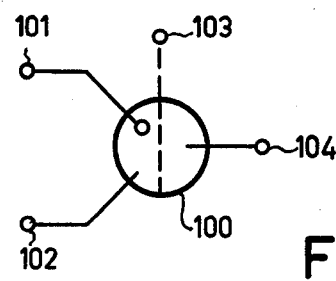
FIG. 4 shows a diagrammatic notation of four-pole circuits of this kind.

FIG. 4 shows a diagram of a four-pole circuit module in accordance with the invention. Circuit 100 has two signal input lines 101, 102, a control line 103 which is denoted by an interrupted line, and a signal output line 104. Line 104 is connected to line 101, denoted by a circle, under control of a first value (0) of the signal on the control line, while under control of a second value (1) of the signal on the control line it is connected to line 102. The symbolic notation is as follows:

101:Y0; 102:Y1; 103:X; 104:Y.

The following connections are formed:

X=0 Y:=Y0; X=1 Y:=Y1.

In a single formula:

Y(Y0, Y1)X

It is to be noted that the notation of FIG. 4 is symbolic. For example, the control line may concern the single construction shown in FIG. 1a as well as the double construction shown in FIGS. 1b and 3. The system aspects of the use of such four-pole circuit. Modules can be found with medium scale integration (MSI) or large scale integration (LSI) of electronic elements in one semiconductor body. In the case of such a set-up, use is increasingly made of random access memories (RAM) and read-only memories (ROM). The first type of memory is usually used for the storage and transfer of data, particularly in an organization comprising a BUS-line. The second type of memory is used particularly for the decoding of input signals and the generation of control signals. In both cases, the transport of signals is important. In the described four-pole circuit, a clean distinction exists between data signals (lines 101, 102, 104) and control signals (line 103), so that there are two logic levels (two level logic). In the case of iterative modular use, a circuit element of this kind is also useful for the formation of logic and arithmetic functions between the bit signals of data words which are stored in two different word rows of random access memories, as will be described in detail hereinafter.

Figure 5:
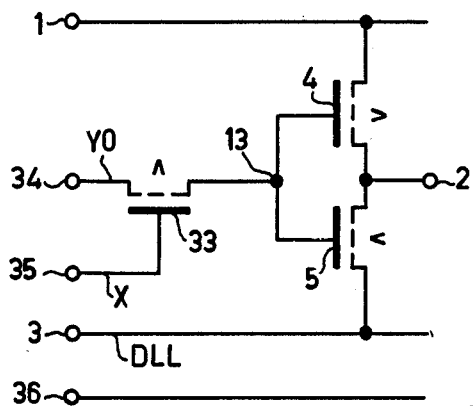
FIG. 5 shows a level converter added to the circuit of FIG. 1.

FIG. 5 shows a level converter added to a circuit as shown in FIG. 1, and involves partly the same reference numerals. Terminal 1 is connected to a positive potential, while terminal 36 is connected to a negative potential. In this sub-circuit, the latter is shown only as a reference, but has no further function therein. The control signal (X) can be applied to the control electrode of p-channel transistor 33 which also receives the data signal Y0 on terminal 34. Terminal 3 can receive a signal value which is defined for the time being as low data value (data level low, DLL). As long as the level of the control signal X is at least a threshold voltage of a p-channel transistor below the DLL level, the level of the output signal 2 is in accordance with the inverted value of the data signal Y0. In given cases, this requirement is too strict in view of the steep transfer characteristic of an inverter constructed according to complementary MOS-technology. Hereinafter, the control signals are referred to as "plus" and "minus", respectively, the data signals being referred to as "plus" and "DLL", "DLL" being at least a threshold voltage of a p-channel transistor above "minus". Proper operation of the circuit shown in FIG. 5 is obtained if the value of the data signal Y0 varies either between the said limits for a control signal or between those for a data signal. A signal of this kind, obtained as data signal (DLL or plus) cannot be used for control purposes (plus or minus).

Figure 6:
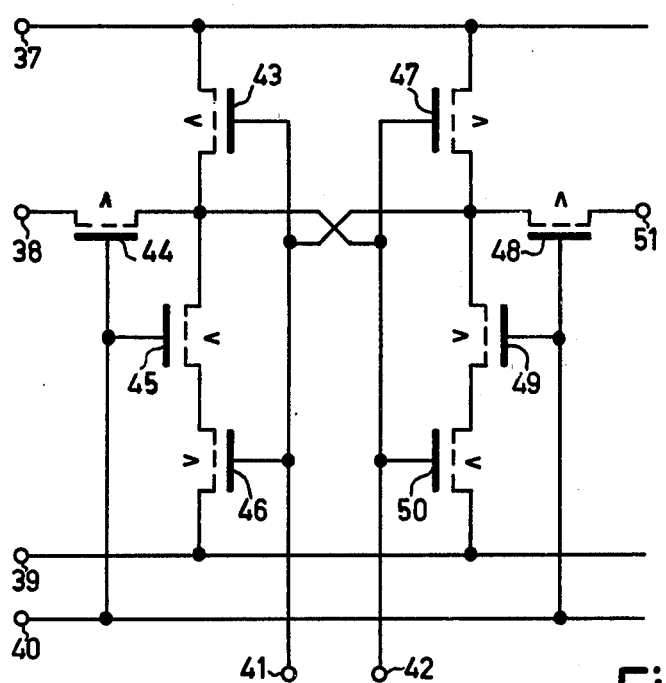
FIG. 6 shows an adaptation/hold circuit.

In this respect, FIG. 6 shows a further elaborated signal level converter which, moreover, has a memory action as a result of feedback. The circuit comprises signal inputs 38, 40, 51 supply inputs 37, 39, signal outputs 41, 42 and eight MOS transistors 43 through 50, the conductivity type thereof being indicated in the usual manner. Supply terminal 37 carries the potential plus, while supply terminal 39 carries the potential minus. Signal terminal 38 carries a data signal (between plus and DLL) and terminal 51 carries the inverted value thereof because an inverting amplifier (not shown) is inserted. This signal is also determined by the limits "plus" and DLL. Terminal 40 carries the output signal of a clock not shown which has the limits "plus" and "minus" and which is, therefore, a control signal. If the clock signal is low, p-channel transistors 44 and 48 become conductive and n-channel transistors 45, 49 are cut off. As a result, terminals 42, 41 assume the same potential as terminals 38, 51, respectively, and the feedback is rendered inactive. When the clock signal is high again, transistors 44, 48 are cut off and transistors 44, 49 become conductive. In this case transistors 43, 46, 47, 50 are cross-coupled to form a bistable circuit. As a result, the values on 41, 42 remain constant and equal to the latest data on the terminals 38, 51, be it that they now have the amplitude "plus" and "minus", respectively, as a result of the complete feedback.

Figure 7:
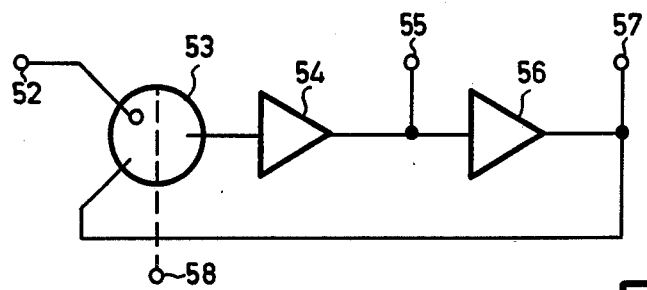
FIG. 7 shows a second adaptation/hold circuit.

FIG. 7 shows a corresponding circuit, comprising an elementary four-pole circuit module 53 in accordance with the invention and two inverters 54, 56. The inverters may be formed in the manner described with reference to FIG. 1a. Feedback is again used to realize a hold circuit which supplies the signal in non-inverted as well as in inverted form on the two terminals 55, 57. In this case, this signal is always a data signal (DLL or "plus") in the hold condition, so that this signal cannot be used as a control signal.

Figure 8:
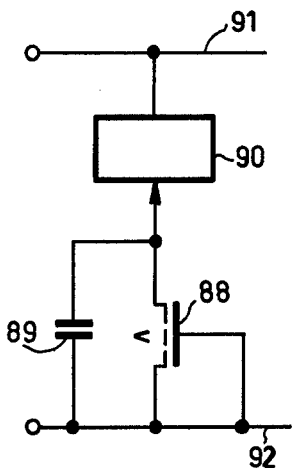
FIG. 8 shows an adaptation circuit.

In the foregoing a circuit has been described for generating a control signal from a data signal (plus or minus). FIG. 8 shows an adaptation circuit for generating a data signal from a control signal. Line 91 carries the potential "plus" and line 92 carries the potential "minus". As a result of the presence of transistor 88 and capacitor 89, circuit 90 (not shown in detail) receives, besides the signal from line 91, a signal which is a threshold voltage of a p-channel transistor higher than that of line 92 and which can thus act as a "DLL" signal. A threshold value of this kind depends on the manufacturing process used. In may have, for example, a nominal value of 1.6 volts, and as a result of the spread in the properties of the circuit elements, it may be between 1.0 and 20 volts. Between the two logic levels there may be a difference of 5 to 10 volts, the value of this difference as well as the absolute situation of the levels relative to a reference level being chosen according to the application.

Figure 9:
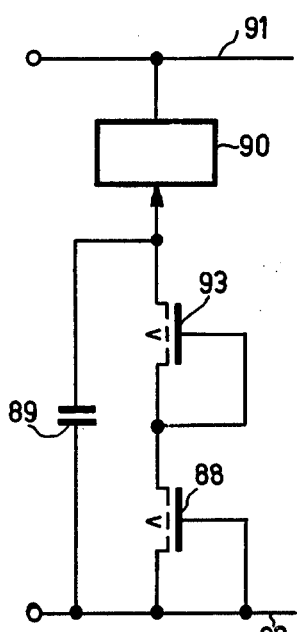
FIG. 9 shows a second adaptation circuit.

FIG. 9 shows a second adaptation circuit. Most elements correspond to those of FIG. 8. As a result of the additional transistor 93, logic circuit 90 receives, besides the signal from line 91, a signal which is two times the threshold value of a p-channel transistor higher than that of line 92 and which can also act as a "DLL" signal. Capacitor 89 may in many cases form an implicit part of the circuit.

The advantages of the invention at the systems level will be described hereinafter.

Figure 10:
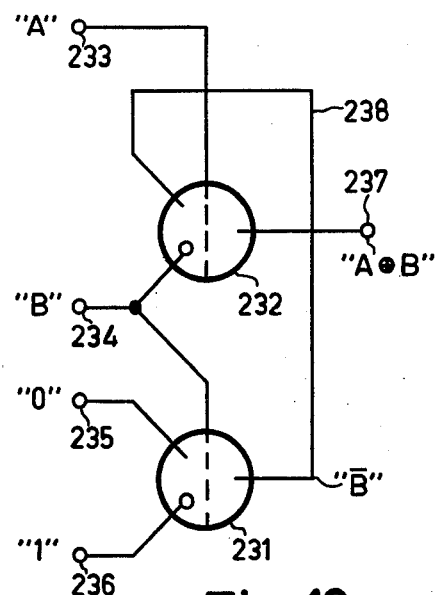
FIG. 10 shows an assembly of two four-pole circuits for inverting a bivalent quantity as well as for forming the EXCLUSIVE-OR combination of two two-valued quantities.

FIG. 10 shows two combined four-pole circuit modules in accordance with the invention. Four-pole circuit 231 receives the binary input signals "1" and "0", and also the binary control signal B. If B=1, the output of four-pole circuit 231 is interconnected with terminal 235 (0); if B=0, this output is interconnected with terminal 236 (1), so that this output statically carries the inverted value $\bar{B}$ of the signal B. Four-pole circuit 232 receives the binary signals $\bar{B}$ and B, respectively, and also the binary control signal A. If A=1, terminal 237 is interconnected with line 238 and then carries $\bar{B}$. If A=0, terminal 237 is connected with terminal 234 and then carries B. If A=B=1 and if A=B=0, terminal 237 carries a binary "0" and in the other case it carries a binary "1", so that the EXCLUSIVE-OR function A • B is realized. The output signal can be converted into a control signal by means of a device of the kind already described.

Figure 11A:
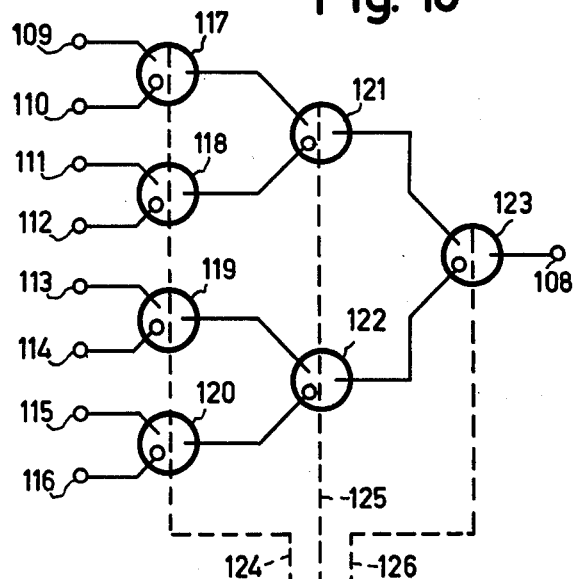
FIGS. 11a and 11b show a multi-input multiplexer and a relevant compact symbol.
Figure 11B:
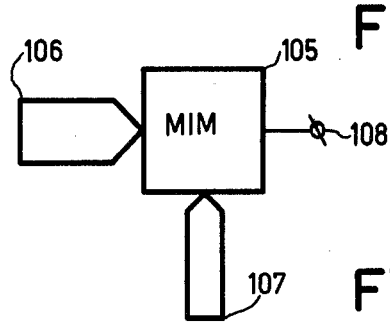

FIG. 11a shows a multi-input multiplexer and FIG. 11b shows a compact symbol therefor (MIM). The device comprises eight signal inputs 109 through 116, seven four-pole circuits modules 117 through 123 in three levels, three control lines 124 through 126, and a signal output terminal 108. Each of the eight possible combinations of the control signals connects a specific signal input to the output 108. In FIG. 11b, symbol 105 has a multiple input line 106, a multiple control ine 107, and a single output line 108.

FIG. 12 is an embodiment of FIG. 11a in the form of an integrated circuit analogous to FIG. 2. The circuit comprises four input terminals 59 through 62, four control lines 63 through 66 which pair-wise receive mutually inverse signals, and an output terminal 67. Each of the p-blocks 68-69-70 (consisting of mutually separated zones ) forms a four-pole circuit module.

Similarly, FIG. 13a shows a multi-output multiplexer and FIG. 13b shows a compact symbol therefor, MOM. This Figure shows a signal input 127, ten reference signal inputs 128 through 137 which are all connected to the logic value "0", fourteen four-pole circuit modules 138 through 151 in accordance with FIG. 4, three control lines 152 through 154, and eight output terminals 155 through 162. Each of the eight possible combinations of control signals connects a specific signal output to the signal input 127. FIG. 13b shows a compact symbol 163 for a MOM circuit of this kind, having a single input line 127, a multiple control line 164, and a multiple output line 165.

Figure 14:
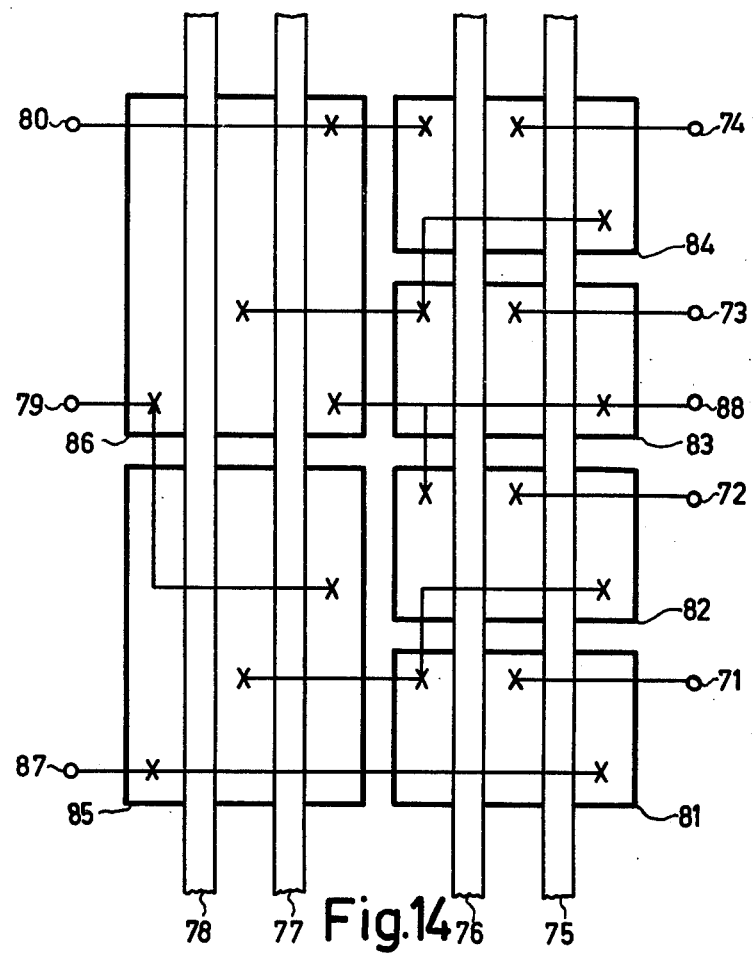
FIG. 14 shows a more detailed embodiment thereof.

FIG. 14 shows a detailed embodiment of FIG. 13a in the form of an integrated circuit analogous to FIG. 2. The circuit has a data input terminal 9, three zero-signal input terminals 80, 87, 88, four control lines 75 through 78 which pair-wise receive mutually inverse signals, and four output terminals 71 through 74. Each of the p-blocks 81 through 86 (again consisting of mutually separated zones) thus forms a four-pole circuit module.

Figure 15:
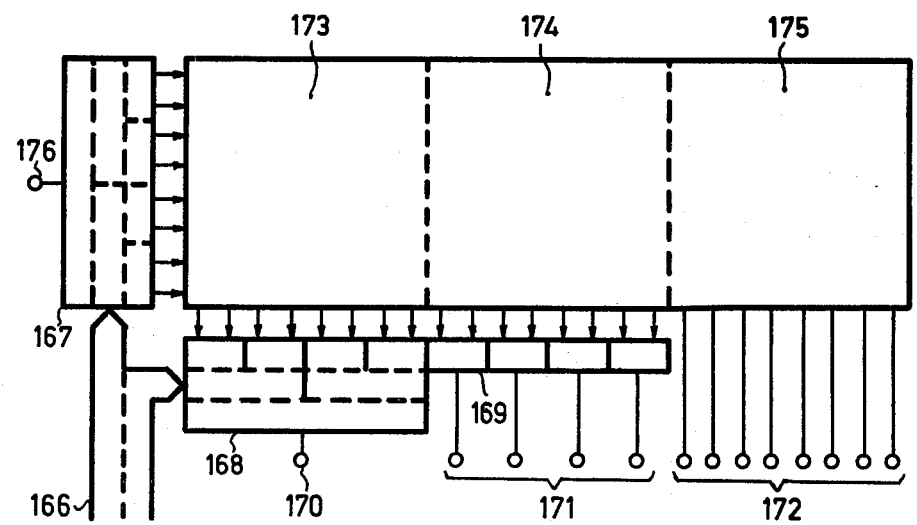
FIG. 15 shows three memory organizations.

FIG. 15 shows an aggregate of three memory arrays, each for a matrix of 8×8 bits. Six address bits arrive along address line 166. Three address bits are for multi-output multiplexer 167 for the x-addressing in conjunction with a read/write control signal on single terminal 176. The remaining three address bits may serve for the y-addressing. Thus, one of rows of matrices 173, 174, 175 is activated. In matrix 173, these three y-address bits control the selection of one of the eight bits read in multi-input multiplexer 168 for output 170. In multiplexers 167, 168, the dotted lines denoted the selection in three levels. Thus, this results in a bit-organized memory of 64 words of 1 bit each. Matrix 174 is addressed by an y-address bit, so that a four-bit word appears on outputs 171 of four two-input multiplexers 169. Matrix 175 is not y-addressed, so that an eight-bit word appears on output 172. Thus, a bit-organized, a word-organized or a hybrid memory may be obtained.

Figure 16:
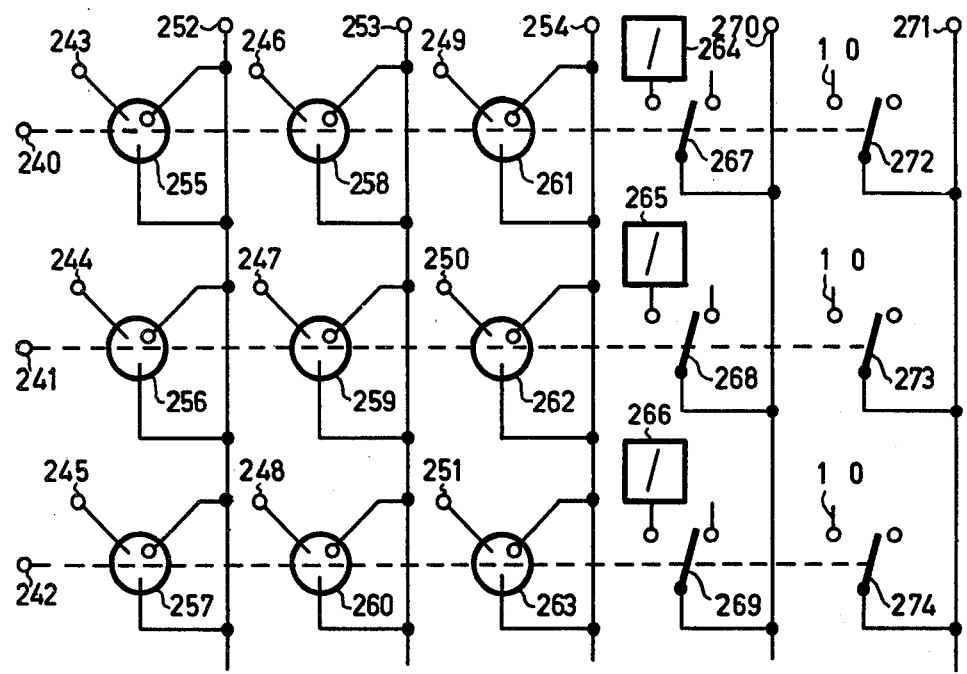
FIG. 16 shows a BUS structure in accordance with the invention.

FIG. 16 in this respect shows a BUS structure in accordance with the invention. Signals on one of the control lines 240 through 242 control the connection state of a row of the four-pole circuits 255 through 263, each of which comprises one data input line (243 through 251) for receiving data. These lines may be connected, for example, to memory positions of the matrices shown in FIG. 15. The other data input lines are shown to be connected to the respective BUS lines. This may indeed be constructed in this way on the chip of semiconductor material. Another possibility is that the relevant connection, including the associated transistor, is omitted, to save space. If a logic "1" appears on a control line, the three-bit data word applied to the respective four-pole circuits thus appears on the parallel BUS-lines. A configuration of this kind can be advantageously tested for the detection whether or not each "BUS" conductor indeed has only one four-pole circuit in the "1" state. The geometrical adaptation of the described elements of FIG. 16 to a circuit comprising the previously described, four-pole elements in an iterative modular arrangement is not difficult, because they may have the same dimensions and also because they can be described by the same functional expression. In the latter case, one of the data input signals is a dummy.

More to the right in FIG. 16, there is shown a BUS conductor 270 which can be connected, by one of switches 267 through 269, to a data output of bistable elements 264 through 266 which thus form part of a random access memory (RAM). The bistable elements may have a conventional construction. For example, in the organization of the matrix 173 in FIG. 15, BUS line 270 and others not shown may be connected to the inputs of multi-input multiplexer and 168 to the outputs o multi-output multiplexer 167. The latter then receives the data to be newly stored. In the second position of switches 267 through 269, the outputs thereof are connected to a dummy contact (isolated point). Similarly, a read-only memory (ROM) can be formed by selectively connecting BUS conductor 271, via one of switches 272 through 274, to an information-carrying contact. The data are then formed in known manner during the manufacture. The second contact is again information-less.

Figure 17:
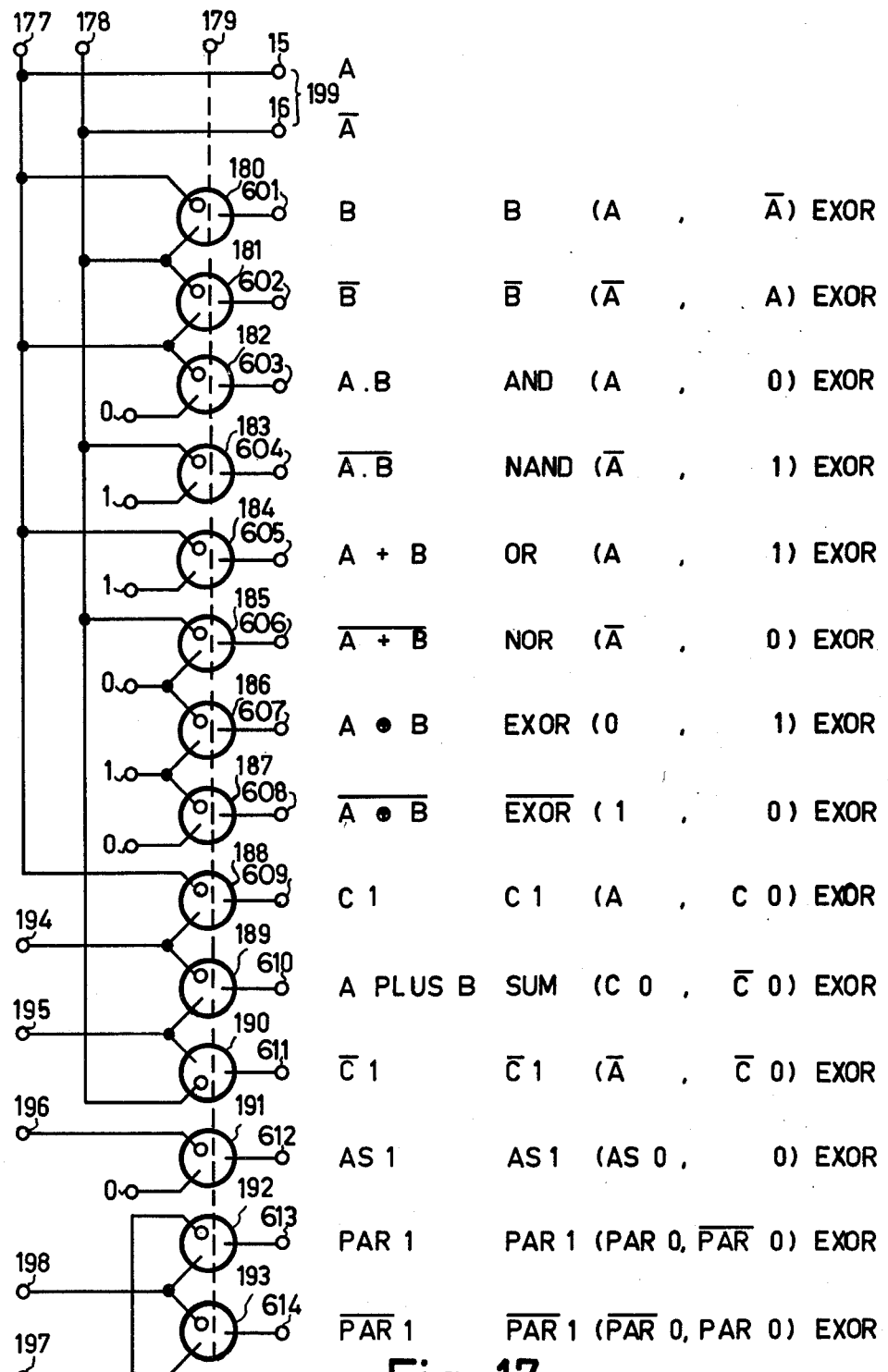
FIG. 17 shows a circuit in accordance with the invention for the formation of logic functions.

FIG. 17 shows a circuit for forming logic and arithmetic functions of two data bits. The combination of a number of one-bit chips of this kind results in a device for operation on multi-bit words. The data bit of the first word is assumed to be A, that of the second word B. First, the EXCLUSIVE-OR function of these two bits is formed again: C=A • B. The other logic functions are formed by means of fourteen four-pole modular elements 180 through 193, on the basis of some fixed input signals, "0", "1", and eight input terminals 177 through 179, 194 through 198 which carry the following signals:

177:A
178:$\overline{A}$ (inverted value of A).
179:A ⊗ B
194:Co
195:$\overline{Co}$
196:ASo
197:PARo
198:$\overline{PARo}$ First of all, the quantities A and $\overline{A}$ are again present without further processing on outputs 199. The quantity B is recovered by circuit element 180: if A ⊗ B=1, input 178 is interconnected ($\overline{A}$); if A ⊗ B=0, input 177 is interconnected. However, $\overline{B}$ is recovered by circuit element 181: if A ⊗ B=0, input 178 is interconnected. The expressions at the right of FIG. 17 show the notation given with reference to FIG. 4. Circuit elements 182 through 185 form the AND-connections and OR-connections, and their respective complementary values. Circuit elements 186 and 187 recover the function A ⊗ B and its inverted value. In given cases, this may be superfluous, because the signal A ⊗ B is already present on terminal 179. An additional advantage of the circuit given may then be embodied in exact correspondence in synchronization and logic signal levels of the outputs of the various circuit modules 180 through 193. Similarly, for example, the signal A can also be generated by connecting both signal inputs of a further circuit element to terminal 177, the control input being connected to terminal 179 (or another signal).

Four-pole element 188 forms, on the basis of a received carry input signal C0, a carry output signal C1. If A=B=1, C1=A, and hence equal to 1. If A=B=0, C1=0. If A≠B, C1=C0. Thus, the formation of such a carry output signal is simple. Similarly, circuit element 190 forms the inverted value of the carry output signal on the basis of the inverted value of the carry input signal $\overline{C0}$. Circuit element 189 forms the sum of A and B. This sum equals the input carry signal C0 if A=B, and equals the inverted value of the input carry signal if A≠B. Similarly, the inverted value of this sum can be generated.

Circuit element 191 generates a bit signal on the basis of the comparison of two multi-bit data words. If A=B, As1=As0. This association bit propagates through the entire word only if all data bits of two words correspond pair-wise. This propagation may commence with the least-significant data bit. Terminal 196 is then connected to a logic "1" signal (like circuit element 187). The propagation may also proceed in the other direction, and stops when the first pair of non-corresponding data bits is encountered.

Circuit element 192 produces a parity check on one of the two input words, for which purpose the other word is made equal to (0 . . . 0). For example, if the signal PARo on the terminal 197 has the value 0 ($\overline{PARo}$=1 on the terminal 198) and the value of A ⊗ B=0 (so A=B=0), PAR1=0, so that the parity remains even without change. If in the same case A ⊗ B=1 (A≠B), PAR 1=1, so that the parity of the entire multi-bit data word can be determined upon propagation of the signal PAR. Similarly, circuit element 193 generates the inverted parity signal. For the least-significant data bit, the signal on terminal 197 is to be made equal to zero and the signal on terminal 198 equal to one.

Figure 18:
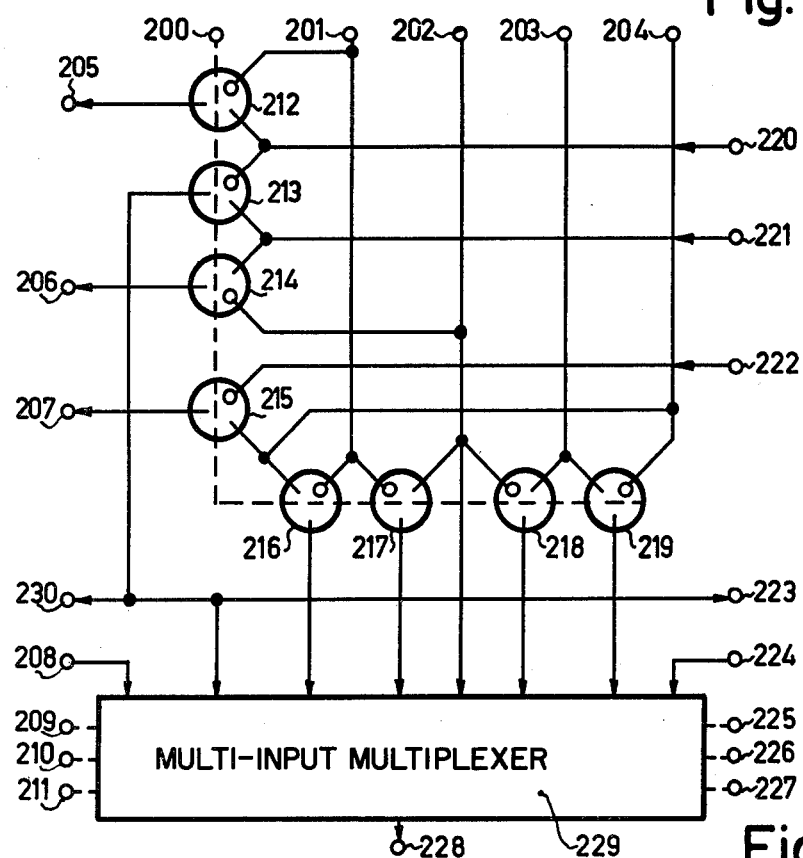
FIG. 18 shows a one-bit stage of an arithmetic and logic unit.

On the basis of the foregoing, FIG. 18 shows a one-bit chip of an arithmetic and logic unit obtained by a suitable choice from the functions formed. The input terminals carry the following signals, the references stated between brackets referring to corresponding terminals in FIG. 17: 200 (179): A ⊗ B; 201 (177): A; 202 (178): $\overline{A}$; 203: 1; 204: 0; 220 (194): C0; 221 (195): $\overline{C0}$; 222 (196): ASo; 224: SUM 0; 208: SUM 2. The following eight connections are thus formed: 212 (188): C1; 213 (189): SUM 1; 214 (190): $\overline{C1}$; 215 (191): AS1; 216 (182): A.B; 217 (180): B; 218 (185): A+B; 219 (186): A ⊗ B. Modular element 229 is a multi-input multiplexer as shown in FIGS. 5/6 and is operated by three control lines which may also be common to other one-bit stages of the multiplexer: 209/225; 210/226; 211/227. The output signal on terminal 228 can be formed in accordance with the table given in FIG. 12. Thus, six logic combinations can be formed, together with two shift operations over one bit in the more-significant direction as well as in the less-significant direction (the latter is situated at the right in FIG. 18). For processing a word comprising N bits, the circuit shown in FIG. 18 must be present a corresponding number of times. Similarly, other logic connections can be chosen from FIG. 17.

FIG. 19 shows the functions which are performed by the circuit shown in FIG. 18 and which appear on output terminal 228 under the control of the various signal combinations on control terminals 209, 210, 211 of multi-input multiplexer 229.

FIG. 20 shows a lay-out of FIG. 18 as an integrated circuit. The device comprises eight vertically extending polysilicon paths 511 through 518 which are continuous or not and which act as conductors. There are also present eight locations which extend from left to right and on which continuous or noncontinuous aluminium conductor paths are arranged; 501 through 505, 519 through 521. Line 511 receives the data signal A; line 518 receives the data signal NA; lines 512, 514, 517 receive the control signal EXOR, lines 513, 515, 516 receive the control signal NEXOR which has been inverted with respect thereto. Line 501 receives the data signal CIN; line 502 receives the data signal NCIN which has been inverted with respect thereto; line 503 receives the data signal ASIN; line 504 receives the static data signal "low" (DLL); line 505 receives the static signal "high" (plus). On terminal 506, the data signal COUT appears. The data signal NCOUT appears on terminal 507. The data signal ASOUT appears on terminal 508. Terminal 509 is connected to an input terminal for receiving the data signal "DLL". Similarly, terminal 510 is connected to an input terminal in order to receive the data signal "plus". The signals on terminals 506 through 508 thus have the caracter of a carry signal for a next-higher significance level. On the other side, a bit signal appears on terminal 522 which forms the sum of the input words, while taking into account the input carry CIN. On terminal 523 the AND-signal of the input quantities appears. The EXCLUSIVE-OR-signal appears on terminal 524. The NOR-signal appears on terminal 525. The sum signal also appears on terminal 526. Terminals 509, 510, 522 through 525 thus function in parallel with respect to bit signals of different significance levels of the two multi-bit input words. The foregoing thus represents a compact modular element of a multi-bit arithmetic member.

Figure 21:
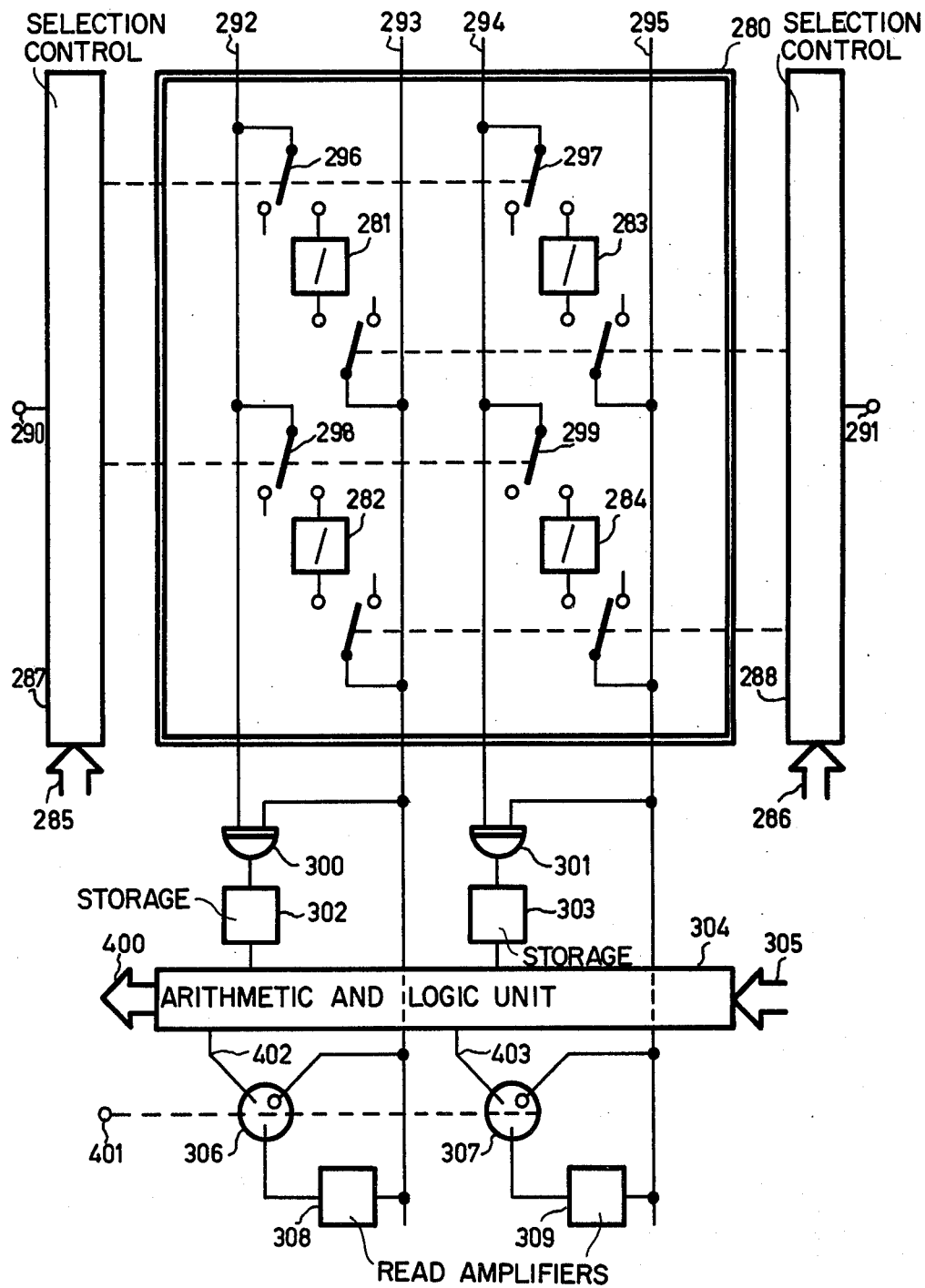
FIG. 21 shows a device for the processing of data signals in accordance with the invention.

FIG. 21 shows a device for processing data signals in accordance with the invention. The assembly is organized around a random access memory, and may therefore be referred to as a "memory oriented processor" or MOP. For the sake of simplicity, only four memory bit positions 281 through 284 are shown in the same manner as in FIG. 16 (264 through 266). The memory matrix 280 has a double selection facility. To this end, each of the multi-output multiplexers 287 through 288 has multiple address inputs 285 through 286. Furthermore, a selection control input 290 through 291 is provided for synchronization, it being possible for the signal to originate from a control device which is not shown for the sake of simplicity. Line pairs 292/294, 293/295 form a two-bit-BUS line which, in the case of appropriate control by multi-output multiplexers 287/288, can receive the data of bistable elements 281 through 284 through switches 296–299. Thus, two words of two bits can be read simultaneously for further processing. The 2×2 organization, obviously, is a very simple example, while a storage capacity of, for example 1k words of 16 bits may also be advantageous. The memory may then also be bit-organized. Lines 292 through 295 are connected to inputs of EXCLUSIVE-OR gates 300, 301 which may be constructed in the manner already described, the output data thereof being temporarily stored in stages 302, 303 which are constructed, for example, as read amplifiers. BUS lines 293,295 continue (denoted by a dotted line) and reach, through four-pole circuit elements 306, 307, stages 308, 309 which are also constructed as read amplifiers for temporary data storage. The signal on control input 401 controls a read operation in memory 280 in this mode of operation. The data of element pairs 302/303 and 308/309 can be processed, as already described, in arithmetic and logic unit 304 which can furthermore receive multi-bit control signals, on input 305, also from said control unit. Multiple input 305 may also be connected to a multiplexer which acts as a control decoder in order to select the correct information per bit position. The data thus formed are temporarily stored again in circuit elements 308, 309, under the control of the signal value other than the former signal value, on control input 401, by data output lines 402, 403; said circuit elements 308, 309 thus also serving as an accumulator register. The data in elements 308/309 can subsequently be stored, under the control of a rewrite signal on input 291 and appropriate address signals on multiple input 286, in memory 280, or be again applied to arithmetic and logic unit 304 under the control of appropriate signals on multiple input 305. Unit 304 also comprises a special output 400 on which, after propagation of any carry signals over the width of the data treated, special signalling or flag signals may appear. These signals concern, for example, a parity signal or an identity signal between two data words. A unit as shown can also be constructed as the already described control unit. Furthermore, it will be obvious that further applications of the described four-pole circuit modules are within the scope of the invention, i.e. the iterative modular use of these circuits.

FIG. 22 shows a buffer element for carry signals. The input data, which may have the levels "plus" and "DLL", arrive on terminal 310A. These data are applied in non-inverted form, and also via the inverter 311 (which thus also supplies the levels "plus" and "DLL") to storage element 312 which may be constructed as shown in FIG. 6. Synchronization is realized by a clock signal on the line 314. If clock signal is low, the feedback in circuit 312 is deactivated in the described manner, and hence also the driving to full output. The signals on lines 310/326 thus have the values "0" (which means "DLL") and "plus". The remaining part of the circuit serves to make the output signals on lines 310, 326 suitable for use in TTL-circuits which are widely used. Terminals 315, 322 are connected to a high supply potential, while terminal 319 is connected to a low supply potential in accordance with the proportioning of the TTL-technology. If line 314 is low, transistor 318 is conductive and terminal 325 thus has a high level, regardless of what happens in element 312. Transistor 321 is then cut off by this signal, so that terminal 323 is at a low potential, regardless of the circumstances in element 312. If the clock signal is high, transistor 318 is cut off and transistor 324 is conductive. As a result of the signal on line 310, either transistor 316 or transistor 317 is conductive, with the result that the voltage on terminal 325 is controlled to the desired high or low value. If transistor 316 is conductive (310 low), line 326 is high and transistor 320 is conductive (transistor 321 is then cut off). Therefore, line 323 is then low. In the opposite case, transistors 317 and 321 are conductive, while transistors 316, 320 are cut off.

What is claimed is:

1. An integrated circuit for the execution of logical operations on at least three data signals, said circuit comprising:
   at least a first and a second four pole circuit module (121, 123), each module being a series combination of a first and a second MOS-transistor of a single conductivity type between a first end and a second end;
   each said series combination having a first data input terminal at its first end and a second data input terminal at its second end for receiving respective data signals of a first amplitude range;
   with each said series combination said first MOS-transistor having a first gate electrode and said second MOS-transistor having a second gate electrode for receiving mutually inverse control signals of a second amplitude range, said second amplitude range encompassing and being larger than said first amplitude range;
   each said series combination having a first data output terminal situated at the junction of said two MOS-transistors for outputting a data signal of said first amplitude range;
   wherein a first value of said control signal applied to a series combination renders exclusively a current path between said first data input termial and said first data output terminal conductive, while a second value of said control signal renders exclusively a current path between said second data input terminal and said first data output terminal conductive;
   wherein the data output terminal of said first four pole circuit module is coupled to a data input terminal of said second four pole circuit module for effecting a two stage logical operation on at least one data signal receivable on at least one of said data input terminals;
   wherein said integrated circuit furthermore comprises:
   at least one third data input terminal (109-116) for receiving a data signal to at least one first or second data input terminal of said four pole circuit modules;
   register means having a fourth data input terminal connected to at least one said first data output terminal for temporarily storing a data signal generated by at least one of said four pole circuit modules;
   at least two supply terminals (54, 56) for receiving power for powering said register means; and
   at least one second data output terminal (55, 57) for outputting a data signal receivable from an output of said register means.

2. An integrated circuit as claimed in claim 1, wherein said register means comprises a clock driven hold circuit for storing one data bit, said hold circuit comprising:
   a third series combination (43, 46), between a third and a fourth end, of two third MOS transistors of mutually opposite conductivity types interconnected by a MOS transistor (45), said third series combination having a second junction;
   a fourth series combination (47, 50) corresponding to said third series combination between said third and said fourth end, having two fourth MOS transistors interconnected by a MOS transistor (49) and having a third junction;
   means for powering (37, 39) said third and fourth series combinations by supplying said third and fourth ends with supply voltages having a voltage range which encompasses said second amplitude range;
   a network for mutually cross-coupling said second junction to the two gate electrodes of said fourth MOS transistors and said third junction to the two gate electrodes of said third MOS transistors;
   wherein the two further MOS transistors (45, 49) are coupled between the respective second and third junctions and a respective third and fourth MOS transistor, and being of the same conductivity type as the latter, the gate electrodes of said MOS transistors being connected with respective data input terminals of the hold circuit, inputting mutually inverse data input signals while, under control of said clock, simultaneously interrupting at least part of said third and series combinations, the data input signals being receivable on said second and third junctions, and wherein the hold circuit produces output signals (41, 42) on said cross-coupling network having a third amplitude range encompassing said second amplitude range.

3. An integrated circuit as claimed in claim 1, wherein said MOS-transistors have a common semiconductor body having a silicon substrate layer provided with electrically separating inset silicon oxide regions.

* * * * *